(12) United States Patent
Chung

(10) Patent No.: US 7,733,307 B2
(45) Date of Patent: Jun. 8, 2010

(54) EMISSION DRIVER FOR ORGANIC LIGHT EMITTING DISPLAY DEVICE

(75) Inventor: Bo-Yong Chung, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 969 days.

(21) Appl. No.: 11/462,160

(22) Filed: Aug. 3, 2006

(65) Prior Publication Data

US 2007/0040450 A1 Feb. 22, 2007

(30) Foreign Application Priority Data

Aug. 16, 2005 (KR) ............... 10-2005-0074968

(51) Int. Cl.
*G09G 3/30* (2006.01)
*H03K 3/00* (2006.01)
*H03L 5/00* (2006.01)
*G11C 19/00* (2006.01)

(52) U.S. Cl. .................. 345/76; 327/215; 327/333; 327/218; 377/64

(58) Field of Classification Search ............ 345/76
See application file for complete search history.

(56) References Cited

U.S. PATENT DOCUMENTS

| | | | | |
|---|---|---|---|---|
| 4,675,553 A * | 6/1987 | Price et al. | ............ | 327/215 |
| 4,691,122 A * | 9/1987 | Schnizlein et al. | ........ | 327/203 |
| 5,164,612 A * | 11/1992 | Kaplinsky | ............ | 327/108 |
| 5,191,233 A * | 3/1993 | Nakano | ............ | 327/333 |
| 6,215,346 B1 * | 4/2001 | Cairns et al. | ............ | 327/296 |
| 6,314,016 B1 * | 11/2001 | Takasu | ............ | 365/145 |
| 6,377,104 B2 * | 4/2002 | Cairns et al. | ............ | 327/291 |
| 6,586,981 B2 * | 7/2003 | Shibuya | ............ | 327/203 |
| 6,870,895 B2 * | 3/2005 | Osame et al. | ............ | 377/78 |
| 7,365,727 B2 * | 4/2008 | Satoh et al. | ............ | 345/100 |
| 2003/0128180 A1 * | 7/2003 | Kim et al. | ............ | 345/100 |
| 2003/0174115 A1 * | 9/2003 | Washio et al. | ............ | 345/98 |
| 2003/0179174 A1 * | 9/2003 | Matsuda et al. | ........ | 345/100 |
| 2003/0234761 A1 | 12/2003 | Washio | | |

(Continued)

FOREIGN PATENT DOCUMENTS

CN 1332520 1/2002

(Continued)

OTHER PUBLICATIONS

Dawson et al, A Polysilicon Active Matrix Organic Light Emitting Diode Display with Integrated Drivers, 1999, Society of Information Display (SID), pp. 1-4.*

*Primary Examiner*—Richard Hjerpe
*Assistant Examiner*—Dorothy Webb
(74) *Attorney, Agent, or Firm*—H.C. Park & Associates, PLC

(57) ABSTRACT

An emission driver for an organic light emitting display device is disclosed. The emission driver includes a plurality of flip-flops, and each flip-flop selectively receives two input signals and inverts a level of a received input signal. Also, each flip-flop transmits the level-inverted signal to an adjacent flip-flop, inverts the level-inverted signal, and transmits the inverted level-inverted signal to the adjacent flip-flop and as an emission control signal. To invert the level of the received input signal, the emission driver includes a level shifter, which includes transistors of the same conductivity type arranged to reduce power consumption.

16 Claims, 3 Drawing Sheets

U.S. PATENT DOCUMENTS

| | | | |
|---|---|---|---|
| 2004/0051575 A1* | 3/2004 | Machida | 327/218 |
| 2004/0108989 A1* | 6/2004 | Gyouten et al. | 345/100 |
| 2004/0150610 A1* | 8/2004 | Zebedee et al. | 345/100 |
| 2005/0030276 A1* | 2/2005 | Murakami et al. | 345/102 |
| 2005/0156861 A1* | 7/2005 | Song | 345/100 |
| 2007/0080905 A1* | 4/2007 | Takahara | 345/76 |

FOREIGN PATENT DOCUMENTS

| | | |
|---|---|---|
| CN | 1482738 | 3/2004 |
| CN | 1530915 | 9/2004 |
| CN | 1648972 | 8/2005 |
| JP | 64-062019 | 3/1989 |
| JP | 06-138838 A1 | 5/1994 |
| JP | 09-018011 | 1/1997 |
| JP | 09-046216 | 2/1997 |
| JP | 09-246936 | 9/1997 |
| JP | 2001-083941 A1 | 3/2001 |
| JP | 2004-152482 A1 | 5/2004 |
| JP | 2005-055730 | 3/2005 |
| JP | 2005-164802 | 6/2005 |

\* cited by examiner

EMISSION DRIVER FOR ORGANIC LIGHT EMITTING DISPLAY DEVICE

CROSS REFERENCE TO RELATED APPLICATION

This application claims priority to and the benefit of Korean Patent Application No. 10-2005-0074968, filed on Aug. 16, 2005, which is hereby incorporated by reference for all purposes as if fully set forth herein.

BACKGROUND OF THE INVENTION

1. Field of the Invention

The present invention relates to an organic light emitting display device (OLED) and, more particularly, to an emission driver for an OLED.

2. Discussion of the Background

An OLED is a light-emissive display that supplies a scan signal to selected pixels and supplies a data signal to pixels selected by the scan signal so that driving current supplied to an organic light emitting diode in a pixel can be controlled. Whether driving current is supplied to an organic light emitting diode is determined by an emission control signal. The emission control signal is supplied from an emission driver to the pixels.

An emission driver supplies an emission control signal to an active matrix-type pixel in an OLED. A data signal is transmitted to the pixel through a data line, and driving current corresponding to the data signal is supplied to an organic light emitting diode in the pixel in response to the emission control signal. Thus, the emission control signal controls the organic light emitting diode's light characteristics, including intensity and duration.

Each pixel includes an active circuit to store the data signal and to control a light-emission operation in response to the emission control signal. The active circuit can include PMOS transistors, which is common, or NMOS transistors, but all transistors of the active circuit generally have the same conductivity type.

Also, the emission driver may be formed on a single crystalline silicon substrate or on the same substrate as the OLED. When the emission driver is formed on a single crystalline silicon substrate, the emission driver generally uses CMOS transistors to minimize the power consumed during operation. However, when the emission driver is formed on the same substrate as the OLED, the emission driver includes all transistors of either PMOS or NMOS type, and power consumption increases as a result.

An emission driver typically includes a shift register with an arrangement of flip-flops, and data stored in a flip-flop is transmitted to a subsequent flip-flop coupled together in synchronization with a clock signal.

Examples of a shift register are disclosed in Japanese Laid-Open Publication No. 2001-083941, Japanese Patent No. 1994-138838, and Japanese Laid-Open Publication No. 2004-152482.

Japanese Laid-Open Publication No. 2001-083941 discloses a shift register used for a liquid crystal display device (LCD), and the shift register has a structure to prevent a reduction in contrast. Also, a shift register for an LCD, proposed by Japanese Patent No. 1994-138838, is directed to reducing power consumption and shortening the time required to transmit signals. Further, a shift register for an LCD, in which the shift register can change the pulse width of an output signal, is disclosed in Japanese Laid-Open Publication No. 2004-152482. However, the scope of the above-described shift registers, provided to transmit scan signals to LCDs, are restricted to use with LCDs and do not teach similar applications to OLEDs.

SUMMARY OF THE INVENTION

This invention provides an emission driver for an organic light emitting display device (OLED), which has a simple structure and includes transistors of the same conductivity type.

Additional features of the invention will be set forth in the description which follows, and in part will be apparent from the description, or may be learned by practice of the invention.

The present invention discloses an emission driver for an organic light emitting display device including a plurality of flip-flops coupled together in series. Further, a first flip-flop includes a first switching unit receiving a first input signal in response to a first clock signal, a level shifter receiving the first input signal from the first switching unit and outputting an output signal with an inverted level of the first input signal, a second switching unit receiving the output signal in response to a second clock signal and transmitting the output signal to a second flip-flop, and an inverter for inverting the output signal to generate an emission control signal and transmitting the emission control signal to the second flip-flop.

The present invention also discloses method of forming an emission control signal, including outputting a first output signal and a first inverted output signal from a first flip-flop to a second flip-flop, and outputting a second output signal and second inverted output signal from the second flip-flop. Further, the second output signal is delayed by one clock cycle with respect to the first output signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
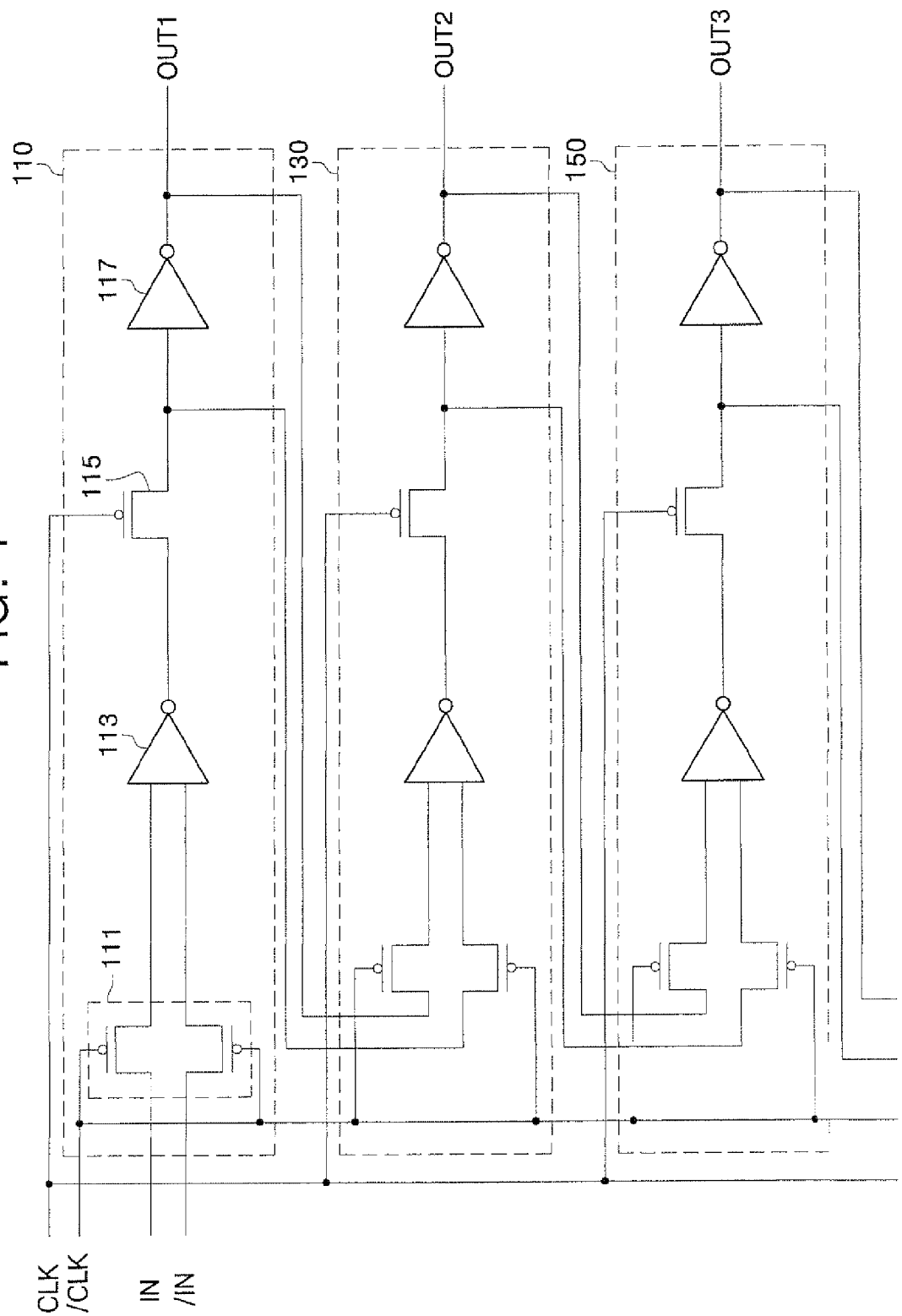
FIG. 1 is a circuit diagram of an emission driver for an OLED according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 is a circuit diagram of an emission driver for an OLED according to an exemplary embodiment of the present invention.

Referring to FIG. 1, the emission driver includes a plurality of flip-flops. A first flip-flop 110 receives an input signal IN and an inverted input signal /IN and outputs the received signals in synchronization with a clock signal CLK and an inverted clock signal /CLK. An output signal OUT1 of the first flip-flop 110 is input to a second flip-flop 130.

The second flip-flop 130 receives the output signal OUT1 and an inverted output signal /OUT1 from the first flip-flop 110 and outputs the received signals in synchronization with the clock signal CLK and the inverted clock signal /CLK. A third flip-flop 150 performs the same shift operation as the second flip-flop 130 as described above.

Although FIG. 1 shows an emission driver with a first flip-flop 110, a second flip-flop 130, and a third flip-flop 150, the present invention is not limited thereto and an emission driver of the present invention may include flip-flops in a number equal to the number of required emission control signals.

The first flip-flop 110, the second flip-flop 130, and the third flip-flop 150 each include a first switching unit 111, a level shifter 113, a second switching unit 115, and an inverter 117.

The first switching unit 111 includes two transistors, which can be PMOS transistors. An inverted clock signal /CLK is applied to a gate terminal of each of the transistors in the first switching unit 111. When the inverted clock signal /CLK is at a low level, PMOS transistors of the first switching unit 111 are turned on. Therefore, when the inverted clock signal /CLK is at a low level, the first flip-flop 110 receives an input signal IN and an inverted input signal /IN, and transmits the received input signal IN and inverted input signal /IN to the level shifter 113.

The level shifter 113 receives the input signal IN and the inverted input signal /IN from the first switching unit 111, inverts the level of a received signal, and outputs the level-inverted signal. Specifically, the inverted input signal /IN controls output impedance of the level shifter 113, and the level shifter 113 inverts the level of the input signal IN and outputs the level-inverted signal, which is transmitted to the source terminal of the second switching unit 115.

The second switching unit 115 has a source terminal coupled with the output terminal of the level shifter 113, and a drain terminal coupled with an input terminal of the inverter 117. The second switching unit 115 includes one transistor, which can be a PMOS transistor. A clock signal CLK is applied to a gate terminal of the PMOS transistor of the second switching unit 115. When the clock signal CLK is at a low level, the PMOS transistor of the second switching unit 115 is turned on and transmits the output signal of the level shifter 113 to the inverter 117.

Also, the signal applied to the gate terminals of the transistors of the first switching unit 111 and the signal applied to the gate terminal of the transistor of the second switching unit 115 can be swapped. For example, the clock signal CLK may be supplied to the gate terminals of the transistors of the first switching unit 111, and the inverted clock signal /CLK may be supplied to the gate terminal of the transistor of the second switching unit 115.

In the first flip-flop 110, the output signal of the second switching unit 115 is supplied to the inverter 117 and to the second flip-flop 130. The inverter 117 inverts the received signal and outputs the inverted signal. The output signal of the inverter 117 is supplied as a second input signal to the second flip-flop 130. Specifically, the output signal of the inverter 117 of the first flip-flop 110 is the input signal to the second flip-flop 130, and the output signal of the second switching unit 115 of the first flip-flop 110 is the inverted input signal to the second flip-flop 130.

The second flip-flop 130 can have substantially the same construction as the first flip-flop 110. However, rather than receiving an input signal IN and inverted input signal /IN, the second flip-flop 130 receives an input signal and an inverted input signal from the first flip-flop 110. Accordingly, the second flip-flop 130 outputs a signal that is delayed by one clock cycle compared to the output signal of the first flip-flop 110.

Figure 2:
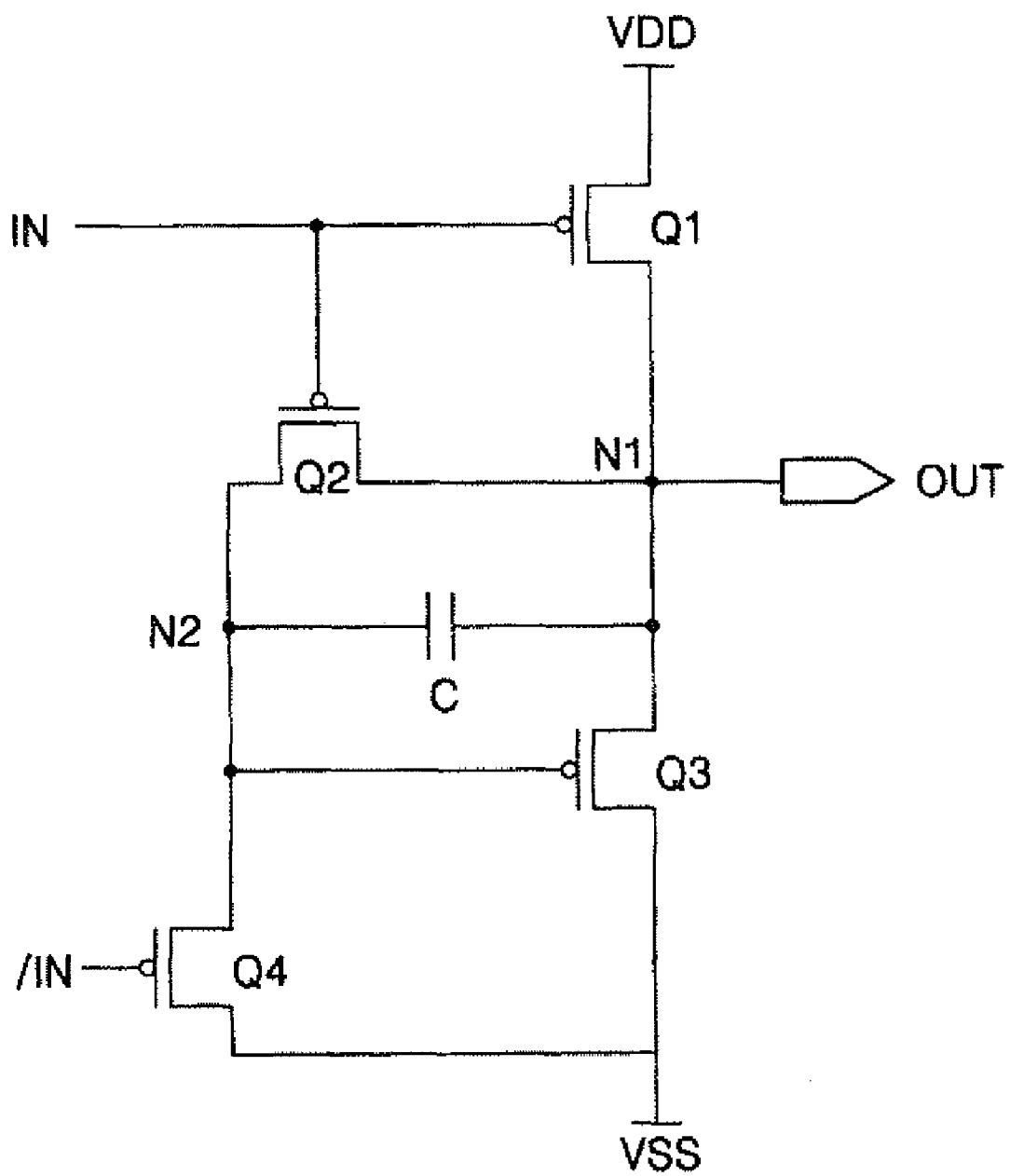
FIG. 2 is a circuit diagram of a level shifter shown in FIG. 1.

FIG. 2 is a circuit diagram of the level shifter of FIG. 1. The structure and operation of the foregoing level shifter 113 as shown in FIG. 2 will now be described.

Referring to FIG. 2, the level shifter 113 is disposed between a VDD rail, which is a positive power supply voltage, and a VSS rail, which is a negative power supply voltage. Also, the level shifter 113 includes four transistors Q1, Q2, Q3, and Q4, which can all be PMOS transistors.

The transistor Q1 is coupled between the VDD rail and a node N1. Node N1 is coupled with the output terminal OUT of level shifter 113. The transistor Q2 is coupled between the node N1 and a node N2. An input signal IN is commonly supplied to a gate terminal of the transistor Q1 and a gate terminal of the transistor Q2. The transistor Q3 is coupled between the node N1 and the VSS rail. Also, a gate terminal of the transistor Q3 is connected to the node N2. The transistor Q4 is coupled between the node N2 and the VSS rail. Also, an inverted input signal /IN is supplied to a gate terminal of the transistor Q4.

The level shifter shown in FIG. 2 may further include a capacitor C coupled between the node N1 and the node N2. The capacitor C can temporarily store voltages at the node N1 and node N2.

When the input signal IN is at a high level and the inverted input signal /IN is at a low level, PMOS-type transistors Q1 and Q2 are turned off and PMOS-type transistor Q4 is turned on. Since the transistors Q1 and Q2 are turned off, current is not supplied from the VDD rail to the node N1 or the output terminal OUT. Accordingly, the transistor Q4 operates in a triode region, and a voltage difference between a source and a drain becomes 0 V when current through the transistor Q4 decreases. The voltage at the node N2 becomes a voltage VSS, and the transistor Q3 is diode-connected. As a result of the diode-connected transistor Q3, the voltage at node N1 becomes a low level of VSS+|Vth| where |Vth| refers to a magnitude of a threshold voltage of the transistor Q3. Further, since node N1 is at a low level when the input signal IN is at a high level, the level shifter outputs a low level signal from output terminal OUT.

When the input signal IN is at a low level and the inverted input signal /IN is at a high level, the PMOS-type transistors Q1 and Q2 are turned on, thus providing a current path between VDD rail and nodes N1 and N2, and PMOS-type transistor Q4 is turned off. The node N1 is at a high level when transistor Q1 turns on, and the node N2 is at a high level when transistor Q2 turns on. Since a high level signal is applied to the node N2, the transistor Q3 is turned off. Thus, a current path between the VSS rail and nodes N1 and N2 is cut off when transistors Q3 and Q4 are turned off. Further, since node N1 is at a high level when the input signal IN is at a low level, the level shifter outputs a high level signal from output terminal OUT. Additionally, since the transistor Q1 operates in the triode region, a high level voltage of the node N1 is substantially equal to a voltage of the VDD rail.

Regardless of whether the output signal of the level shifter is at a low level or high level, no current path exists between the VDD rail and the VSS rail. Accordingly, power consumed by the level shifter can be reduced as if the level shifter were comprised of CMOS transistors.

Also, the inverted input signal /IN is used to control impedance of the node N1 coupled with output terminal OUT. When the inverted input signal /IN is at a low level, the PMOS-type transistors Q3 and Q4 are turned on, and the PMOS-type transistors Q1 and Q2 are turned off. Due to the turned-off transistors Q1 and Q2, the impedance from the output terminal OUT is high. Also, when the inverted input signal /IN is at a high level, since the transistors Q3 and Q4 are turned off, the impedance from the output terminal OUT remains high.

Figure 3:
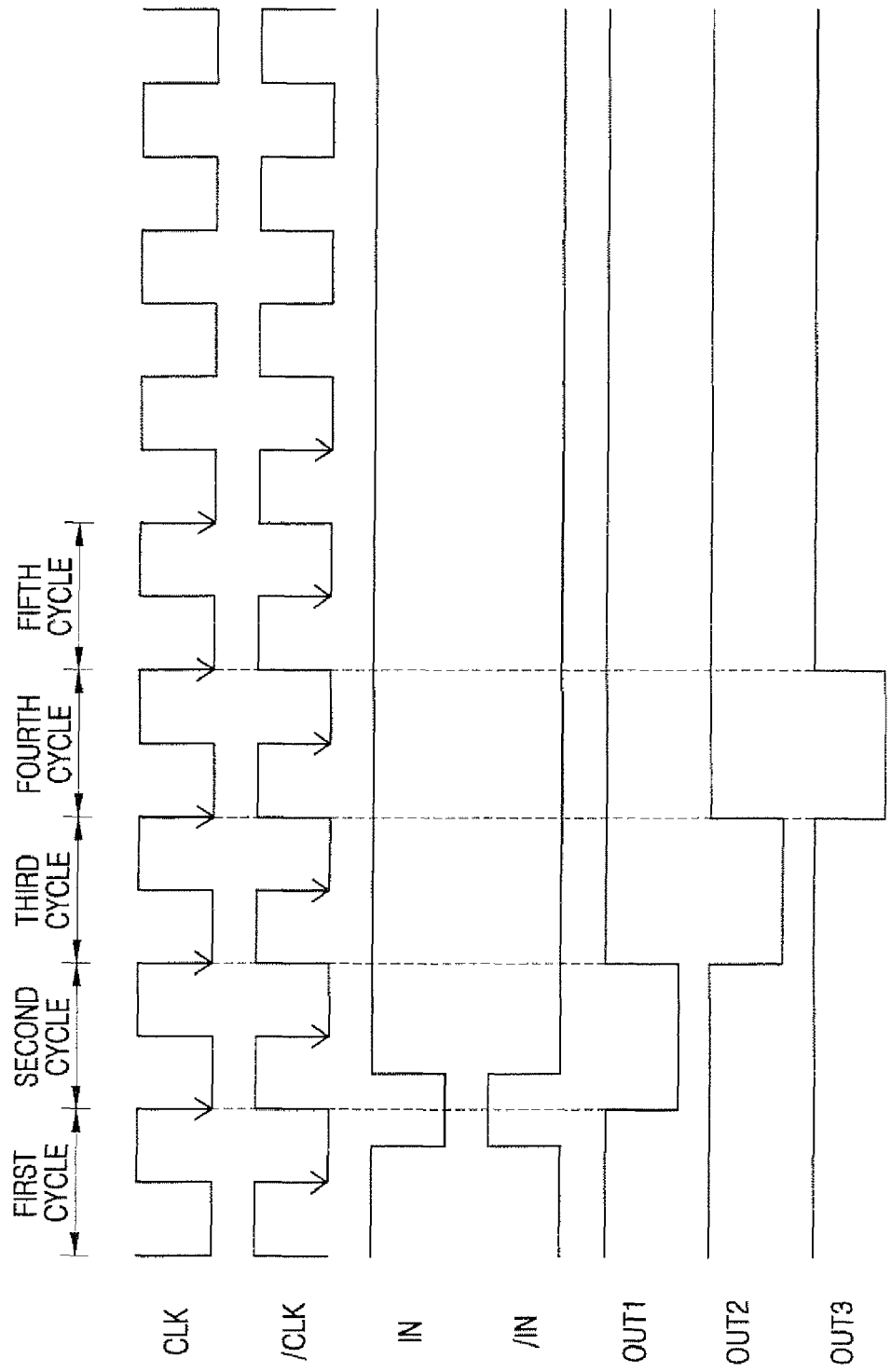
FIG. 3 is a timing diagram illustrating the operation of the emission driver shown in FIG. 1.

FIG. 3 is a timing diagram illustrating the operation of the emission driver shown in FIG. 1.

Referring to FIG. 1 and FIG. 3, the first switching unit 111 receives an input signal IN and an inverted input signal /IN during a low-level period of a first cycle of an inverted clock signal /CLK. Also, the input signal IN and the inverted input signal /IN are output from the first switching unit 111 and input to the level shifter 113. The level shifter 113 inverts the input signal IN and outputs the inverted signal. When the input signal IN is at a low level on the falling edge of the second cycle of the clock signal CLK, the second switching unit 115 samples the high level output signal of the level shifter 113, which inverted the low level input signal IN. The sampled high level signal is input to the second flip-flop 130 and the inverter 117. The inverter 117 inverts the high level input signal and outputs a low level signal as a first emission control signal OUT1.

During a low-level period of a second cycle of an inverted clock signal /CLK, the input signal IN remains at a high level. The level shifter 113 receives a high level input signal IN and outputs the received signal as a low level signal to the second switching unit 115. The second switching unit 115 samples the low level output signal of the level shifter 113 on a falling edge of a third cycle of the clock signal CLK. Accordingly, the second switching unit 115 outputs a low level signal on the falling edge of the third cycle of the clock signal CLK. The received low level signal from the second switching unit 115 is inverted by inverter 117 to a high level signal, and an output signal OUT1 of the first flip-flop 110 transitions to a high level signal on the falling edge of the clock signal CLK.

The second flip-flop 130 receives the output signal of the second switching unit 115 of the first flip-flop 110 and the output signal OUT1. The output signal of the second switching unit 115 is an inverted input signal of the second flip-flop 130, and the output signal OUT1 of the first flip-flop 110 is an input signal of the second flip-fop 130. The second flip-flop 130 receives the output signal OUT1 during a low level period of the second cycle of the inverted clock signal /CLK, samples an inverted signal of the output signal OUT1 on a falling edge of the third cycle of the clock signal CLK, and outputs the sampled signal. Accordingly, the second flip-flop 130 outputs an output signal OUT2 that is delayed by one clock cycle with respect to the output signal OUT1 of the first flip-flop 110.

The third flip-flop 150 performs the same operation as the second flip-flop 130 as described above. Accordingly, the third flip-flop 150 outputs an output signal OUT3 that is delayed by one clock cycle relative to the output signal OUT2 of the second flip-flop 130.

The output signals OUT1, OUT2, and OUT3 are thus sequentially delayed by one clock cycle and output as emission control signals.

First flip-flop 110, second flip-flop 130, and third flip-flop 150 can each include the level shifter 113 to minimize power consumption. Even though the level shifter 113 includes transistors of the same conductivity type, it can substantially reduce power consumption to the same extent as a level shifter with CMOS transistors.

Although it is disclosed in the present embodiment that the first flip-flop 110, second flip-flop 130, and third flip-flop 150 each include the inverter 117 as described, the inverter 117 may be provided as a latch type inverter. Specifically, a latch in which a reverse inverter is installed parallel to an inverter may be provided instead of the inverter 117 as described herein.

Furthermore, in the present exemplary embodiment, the output signal of first flip-flop 110, second flip-flop 130, and third flip-flop 150 each has a duty cycle equal to one clock cycle. However, the duty cycle of the output signal of first flip-flop 110, second flip-flop 130, and third flip-flop 150 may each be changed if necessary by controlling the duty cycle of the input signal and the inverted input signal.

According to the present invention as described above, an emission driver of an OLED can be provided using transistors of the same conductivity type. Although the transistors have the same conductivity type, the emission driver can minimize power consumption. In particular, when a level shifter, which can consume excessive power during operation, includes transistors of the same conductivity arranged as disclosed in the present invention, the level shifter can substantially reduce power consumption to a substantially similar extent as a level shifter comprised of CMOS transistors.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An emission driver for an organic light emitting display device, comprising:
    a plurality of flip-flops coupled together in series,
    wherein a first flip-flop comprises:
        a first switching unit to transmit a first input signal in response to a first clock signal;
        a level shifter to receive the first input signal from the first switching unit and to output an output signal with an inverted level of the first input signal;
        a second switching unit to receive the output signal and to transmit the output signal to a second flip-flop in response to a second clock signal; and
        an inverter to invert the output signal to generate an emission control signal and transmit the emission control signal to the second flip-flop.

2. The emission driver of claim 1, wherein the second flip-flop comprises:
    a third switching unit to receive the emission control signal and the output signal of the second switching unit in response to the second clock signal.

3. The emission driver of claim 1, wherein the level shifter comprises:

a first transistor coupled between a VDD rail and a first node that is an output terminal, the first transistor to receive the first input signal;

a second transistor turned on or off in response to the first input signal, and coupled between the first node and a second node;

a third transistor turned on or off in response to a level of the second node, and coupled between the first node and a VSS rail; and a fourth transistor turned on or off in response to a second input signal, and connected between the second node and the VSS rail.

4. The emission driver of claim 3, wherein the first transistor, second transistor, third transistor, and fourth transistor have the same conductivity type.

5. The emission driver of claim 4, wherein the level shifter further comprises a capacitor coupled between the first node and the second node.

6. The emission driver of claim 3, wherein the second input signal is an inverted signal of the first input signal.

7. The emission driver of claim 1, wherein the first switching unit comprises:

a first switching transistor that is turned on or off in response to the first clock signal, the first switching transistor to receive the first input signal; and a second switching transistor that is turned on or off in response to the first clock signal, the second switching transistor to receive a second input signal.

8. The emission driver of claim 7, wherein the first switching transistor and the second switching transistor are coupled in parallel with each other.

9. The emission driver of claim 8, wherein the first switching transistor and the second switching transistor are PMOS transistors.

10. The emission driver of claim 1, wherein the second switching unit is a PMOS transistor and receives the second clock signal at a gate terminal.

11. The emission driver of claim 7, wherein the second input signal is an inverted signal of the first input signal.

12. The emission driver of claim 1, wherein the first clock signal is an inverted signal of the second clock signal.

13. A method of forming an emission control signal, comprising:

outputting a first output signal and a first inverted output signal from a first flip-flop to a second flip-flop; and outputting a second output signal and second inverted output signal from the second flip-flop, wherein the second output signal is delayed by one clock cycle with respect to the first output signal and wherein the first flip-flop comprises: a first switching unit to transmit a first input signal in response to a first clock signal; a level shifter to receive the first input signal from the first switching unit and to output the first output signal with an inverted level of the first input signal; a second switching unit to receive the first output signal and to transmit the first output signal to a second flip-flop in response to a second clock signal; and an inverter to invert the first output signal to generate an emission control signal and transmit the emission control signal to the second flip-flop.

14. The method of forming an emission control signal of claim 13, wherein the step of outputting a first output signal and a first output signal further comprises:

transmitting an input signal and an inverted input signal to a level shifter in response to an inverted clock signal;

inverting a level of the input signal or a level of the inverted input signal to a high level or a low level to generate a level-inverted signal, the high level corresponding to a VDD rail and the low level corresponding to a VSS rail;

outputting the level-inverted signal to the second flip-flop as the first inverted output signal; and inverting the first inverted output signal to generate the first output signal and inputting it to the second flip-flop.

15. The method of forming an emission control signal of claim 14, wherein the outputting of the level-inverted signal is synchronized with a clock signal.

16. The method of forming an emission control signal of claim 14, wherein the level-inverted signal has substantially the same level as the VDD rail or the VSS rail.

* * * * *